(12) United States Patent
Zou et al.

(10) Patent No.: US 10,971,890 B2
(45) Date of Patent: Apr. 6, 2021

(54) MICRO LASER DIODE TRANSFER METHOD AND MANUFACTURING METHOD

(71) Applicant: Goertek, Inc., Weifang (CN)

(72) Inventors: Quanbo Zou, Weifang (CN); Zhe Wang, Weifang (CN)

(73) Assignee: Goertek, Inc., Shandong (CN)

( * ) Notice: Subject to any disclaimer, the term of this patent is extended or adjusted under 35 U.S.C. 154(b) by 0 days.

(21) Appl. No.: 16/465,745

(22) PCT Filed: Dec. 5, 2016

(86) PCT No.: PCT/CN2016/108557
§ 371 (c)(1),
(2) Date: May 31, 2019

(87) PCT Pub. No.: WO2018/102961
PCT Pub. Date: Jun. 14, 2018

(65) Prior Publication Data
US 2019/0386454 A1 Dec. 19, 2019

(51) Int. Cl.
*H01S 5/02* (2006.01)
*H01S 5/042* (2006.01)
(Continued)

(52) U.S. Cl.
CPC .......... *H01S 5/0216* (2013.01); *H01S 5/0217* (2013.01); *H01S 5/0234* (2021.01); *H01S 5/04256* (2019.08); *H01S 5/18369* (2013.01); *H01S 5/423* (2013.01); *H01S 5/022* (2013.01); *H01S 5/4093* (2013.01)

(58) Field of Classification Search
CPC ... H01S 5/42–423; H01S 5/4087–4093; H01S 2301/176; H01S 5/04256; H01S 5/0226; H01S 5/02272; H01S 5/183–18397; H01S 5/0216; H01S 5/0217; H01S 5/0224
See application file for complete search history.

(56) References Cited

U.S. PATENT DOCUMENTS 4,211,586 A * 7/1980 Fang ............... H01L 27/153
257/90
4,888,085 A * 12/1989 Smith ............... H01S 5/4031
438/35
(Continued)

FOREIGN PATENT DOCUMENTS

CN 105493297 A 4/2016
CN 105493298 A 4/2016
(Continued)

*Primary Examiner* — Joshua King
(74) *Attorney, Agent, or Firm* — Baker Botts L.L.P.

(57) ABSTRACT

A micro laser diode transfer method and a manufacturing method comprise: forming a bonding layer (515) on a receiving substrate (513), wherein first type electrodes (514) are connected to the bonding layer (515); bringing a first side of the micro laser diodes (500r) on a carrier substrate (520) into contact with the bonding layer (515), wherein the carrier substrate (520) is laser-transparent; and irradiating selected micro laser diodes (500r) with laser from the side of the carrier substrate (520) to lift-off the selected micro laser diodes (500r) from the carrier substrate (520). This method may improve yield.

7 Claims, 5 Drawing Sheets

(51) Int. Cl.
  *H01S 5/183* (2006.01)
  *H01S 5/42* (2006.01)
  *H01S 5/0234* (2021.01)
  *H01S 5/022* (2021.01)
  *H01S 5/40* (2006.01)

(56) References Cited

U.S. PATENT DOCUMENTS

| | | | | |
|---|---|---|---|---|
| 5,104,824 A * | 4/1992 | Clausen, Jr. | ........ | H01L 21/3081 148/DIG. 26 |
| 5,244,818 A * | 9/1993 | Jokerst | .................... | H01L 21/78 117/915 |
| 5,408,105 A * | 4/1995 | Adachi | .................. | H01S 5/423 257/13 |
| 5,583,351 A * | 12/1996 | Brown | .................. | B82Y 20/00 257/184 |
| 5,677,924 A * | 10/1997 | Bestwick | .............. | H01L 33/105 372/96 |
| 5,903,585 A * | 5/1999 | Dawson | ................ | H01S 5/0612 372/45.01 |
| 6,117,699 A * | 9/2000 | Lemoff | ................... | H01S 5/423 438/35 |
| 6,222,203 B1 * | 4/2001 | Ishibashi | ............... | B82Y 20/00 257/88 |
| 6,229,503 B1 * | 5/2001 | Mays, Jr. | ............. | G02B 27/017 345/7 |
| 6,388,322 B1 * | 5/2002 | Goossen | ............ | H01L 21/6835 257/737 |
| 6,563,139 B2 * | 5/2003 | Hen | .................... | H01L 25/0753 257/79 |
| 6,674,948 B2 * | 1/2004 | Yeh | .......................... | G02B 6/08 385/120 |
| 6,741,629 B1 * | 5/2004 | Garnache | ........... | H01S 5/02288 372/20 |
| 6,807,211 B1 * | 10/2004 | Cok | ........................ | H01S 5/36 372/39 |
| 7,449,789 B2 * | 11/2008 | Chen | ..................... | B82Y 10/00 257/102 |
| 7,687,812 B2 * | 3/2010 | Louwsma | ........... | H01L 27/156 257/88 |
| 8,680,540 B2 * | 3/2014 | Narui | .................... | B82Y 20/00 257/81 |
| 10,141,287 B2 | 11/2018 | Zou et al. | | |
| 10,157,898 B2 * | 12/2018 | Negley | .................. | H05B 45/00 |
| 10,163,869 B2 | 12/2018 | Zou et al. | | |
| 10,181,546 B2 | 1/2019 | Zou et al. | | |
| 10,319,697 B2 | 6/2019 | Zou et al. | | |
| 2003/0006416 A1 * | 1/2003 | Dudoff | ................. | G02B 6/4204 257/79 |
| 2003/0013217 A1 * | 1/2003 | Dudoff | ................. | G02B 6/4204 438/27 |
| 2003/0013225 A1 * | 1/2003 | Dudoff | ................. | G02B 6/4204 438/59 |
| 2003/0013230 A1 * | 1/2003 | Dudoff | ................. | G02B 6/4204 438/107 |
| 2003/0026303 A1 * | 2/2003 | Ouchi | .................... | H01S 5/423 372/36 |
| 2003/0031218 A1 * | 2/2003 | Yeh | .......................... | G02B 6/08 372/45.01 |
| 2003/0032209 A1 * | 2/2003 | Yeh | ..................... | G02B 6/4204 438/22 |
| 2003/0081638 A1 * | 5/2003 | Hamster | ............ | G02B 6/4204 372/23 |
| 2003/0194168 A1 * | 10/2003 | Ouchi | ............. | G11B 7/123 385/14 |
| 2003/0213950 A1 * | 11/2003 | Hwang | ............ | H01L 21/76256 257/18 |
| 2003/0215969 A1 * | 11/2003 | Miller | ................ | H01S 5/18358 438/29 |
| 2004/0036074 A1 * | 2/2004 | Kondo | ................ | H01L 21/6835 257/79 |
| 2005/0036533 A1 * | 2/2005 | Cox | .................... | H01S 5/18386 372/99 |
| 2005/0047718 A1 * | 3/2005 | Kaneko | ................ | H01S 5/18388 385/33 |
| 2005/0078726 A1 * | 4/2005 | Watanabe | ............... | B82Y 20/00 372/46.01 |
| 2005/0079642 A1 * | 4/2005 | Tamura | ............... | H01L 21/0242 438/22 |
| 2005/0094695 A1 * | 5/2005 | Trezza | ................ | H01S 5/0264 372/50.1 |
| 2005/0276295 A1 * | 12/2005 | Kahen | ............ | G02F 1/133603 372/39 |
| 2007/0217473 A1 * | 9/2007 | Abe | ...................... | H01S 3/0627 372/50.124 |
| 2009/0003401 A1 * | 1/2009 | Sekiguchi | ........... | H01S 5/18394 372/50.124 |
| 2010/0283069 A1 * | 11/2010 | Rogers | ............ | H01L 31/02327 257/98 |
| 2011/0151602 A1 * | 6/2011 | Speier | ................ | H01L 33/0079 438/26 |
| 2011/0165707 A1 * | 7/2011 | Lott | ........................ | H01L 33/60 438/27 |
| 2012/0051384 A1 * | 3/2012 | Geske | ................ | H01S 5/18305 372/50.124 |
| 2012/0093189 A1 * | 4/2012 | Fattal | ...................... | H01S 5/423 372/50.11 |
| 2012/0128019 A1 * | 5/2012 | Chang-Hasnain | .......................... | H01S 5/18386 372/45.01 |
| 2012/0288995 A1 * | 11/2012 | El-Ghoroury | ..... | H01L 27/14618 438/107 |
| 2013/0126921 A1 * | 5/2013 | Mohammed | ........ | H01L 33/0079 257/98 |
| 2013/0187174 A1 * | 7/2013 | Tischler | .................. | H01L 27/14 257/80 |
| 2013/0210194 A1 * | 8/2013 | Bibl | ........................ | H01L 24/75 438/107 |
| 2014/0079088 A1 * | 3/2014 | Joseph | ................. | G02B 6/4214 372/50.12 |
| 2014/0087499 A1 * | 3/2014 | Doan | ..................... | B82Y 20/00 438/28 |
| 2014/0094878 A1 * | 4/2014 | Gossler | ................ | A61N 5/0622 607/88 |
| 2014/0111408 A1 * | 4/2014 | Lau | ...................... | G09G 3/3241 345/83 |
| 2014/0354367 A1 * | 12/2014 | Suzuki | .................... | B82Y 20/00 331/94.1 |
| 2015/0008389 A1 * | 1/2015 | Hu | ...................... | H01L 33/0095 257/13 |
| 2015/0340346 A1 * | 11/2015 | Chu | .................... | H01L 25/0753 257/89 |
| 2016/0336717 A1 * | 11/2016 | Lin | ....................... | H01S 5/423 |
| 2017/0063035 A1 * | 3/2017 | Wang | .................. | H01S 5/18305 |
| 2017/0069609 A1 * | 3/2017 | Zhang | .................... | H01L 25/167 |
| 2017/0179097 A1 * | 6/2017 | Zhang | .................. | H01L 27/156 |
| 2017/0373046 A1 * | 12/2017 | Gardner | ............... | H01L 21/6835 |
| 2018/0212404 A1 * | 7/2018 | Enzmann | .............. | H01S 5/0226 |
| 2018/0219123 A1 * | 8/2018 | Wang | ................ | H01L 33/0079 |
| 2019/0245326 A1 * | 8/2019 | Halbritter | ........... | H01S 5/18377 |
| 2019/0312410 A1 * | 10/2019 | Sugiyama | ................ | H01S 5/42 |

FOREIGN PATENT DOCUMENTS

| | | | | |
|---|---|---|---|---|
| CN | 105723528 A | 6/2016 | | |
| CN | 105870265 A | 8/2016 | | |
| CN | 106170849 A | 11/2016 | | |
| EP | 0817340 A1 * | 1/1998 | ............. | H01S 5/423 |
| WO | WO-2014013639 A1 * | 1/2014 | ......... | H01S 5/04253 |
| WO | WO-2015077516 A1 * | 5/2015 | ............. | H01S 5/423 |
| WO | WO-2016190919 A2 * | 12/2016 | ......... | H01S 5/02236 |

* cited by examiner

MICRO LASER DIODE TRANSFER METHOD AND MANUFACTURING METHOD

CROSS-REFERENCE TO RELATED APPLICATIONS

This application is a National Stage of International Application No. PCT/CN2016/108557 filed on Dec. 5, 2016, which is hereby incorporated by reference in its entirety.

FIELD OF THE INVENTION

The present invention relates to micro laser diode, and more specifically, to a method for transferring micro laser diodes and a method for manufacturing a micro laser diode device.

BACKGROUND OF THE INVENTION

The laser diode (LD) has been actively developed recently. Generally, a laser diode or a laser diode array is used as a light source for optical communications or a laser printer. The laser diode could be of a vertical cavity surface emitting laser (VCSEL) structure, which includes a lower contact layer, a lower Bragg reflector layer, a lower spacer layer, an active layer, an upper spacer layer, an upper Bragg reflector layer and an upper contact layer.

In the prior art, micro laser diodes are transferred onto a receiving substrate individually. The common electrode for the micro laser diodes is mounted at bottom on the receiving substrate. The top electrodes of the laser diodes are wire-bonded onto the receiving substrate. Although the laser diode is downsizing and thus an individual micro laser diode can be made, traditional assembling approaches are still used in transfer of the micro laser diode. They are not suitable for the application of a micro laser diode. Furthermore, they are not suitable for a display device using micro laser diodes, especially, a high definition (HD) display device.

US patent application No. 2016/0308333 A1 discloses a laser diode array, method of manufacturing the same, printer and optical communication device, which is hereby incorporated herein by reference.

Micro-LEDs can be used as display light source. But, they are not suitable for projection display. A projection display apparatus using micro-LEDs requires a complicated optical focusing system, which limits its application.

U.S. Pat. No. 9,367,094 B2 discloses a display module and system applications, which is hereby incorporated herein by reference.

Therefore, there is a demand in the art that a new solution for transferring micro laser diodes shall be proposed to address at least one of the problems in the prior art.

SUMMARY OF THE INVENTION

One object of this invention is to provide a new technical solution for transferring micro laser diodes.

According to a first aspect of the present invention, there is provided a method for transferring micro laser diodes, comprising: forming a bonding layer on a receiving substrate, wherein first type electrodes are connected to the bonding layer; bringing a first side of the micro laser diodes on a carrier substrate into contact with the bonding layer, wherein the carrier substrate is laser-transparent; and irradiating selected micro laser diodes with laser from the side of the carrier substrate to lift-off the selected micro laser diodes from the carrier substrate.

Alternatively or optionally, the method further comprises: filling a dielectric filler material among the micro laser diodes to form a dielectric filler layer; and forming second type electrodes connected to a second side of the micro laser diodes.

Alternatively or optionally, forming second type electrodes further includes: forming an electrode layer on the micro laser diodes and the dielectric filler layer; and patterning the electrode layer to expose the micro laser diodes.

Alternatively or optionally, the micro laser diodes are kept on the receiving substrate during lifting-off through at least one of a gravity force, an adhesion force of the bonding layer, an electrostatic force applied to the micro laser diodes and an electromagnetic force applied to the micro laser diodes.

Alternatively or optionally, the micro laser diodes are of vertical cavity surface emitting laser structure, which includes a lower contact layer, a lower Bragg reflector layer, a lower spacer layer, an active layer, an upper spacer layer, an upper Bragg reflector layer and an upper contact layer.

Alternatively or optionally, at least one part of the second type electrodes is formed at a lateral side of the micro laser diodes.

Alternatively or optionally, the micro laser diodes include red, blue and green micro laser diodes.

Alternatively or optionally, the diameter of the micro laser diodes is less than 100 μm.

Alternatively or optionally, the first type electrodes are anodes and the second type electrodes are cathode.

According to a second aspect of the present invention, there is provided a method for manufacturing a micro laser diode device, including transferring micro laser diodes to a receiving substrate of the micro laser diode device by using the method according to the present invention.

According to an embodiment of this invention, the present invention can provide a new approach for transferring micro laser diodes.

Further features of the present invention and advantages thereof will become apparent from the following detailed description of exemplary embodiments according to the present invention with reference to the attached drawings.

BRIEF DESCRIPTION OF THE DRAWINGS

The accompanying drawings, which are incorporated in and constitute a part of the specification, illustrate embodiments of the invention and, together with the description thereof, serve to explain the principles of the invention.

DETAILED DESCRIPTION OF THE EMBODIMENTS

Figure 1:
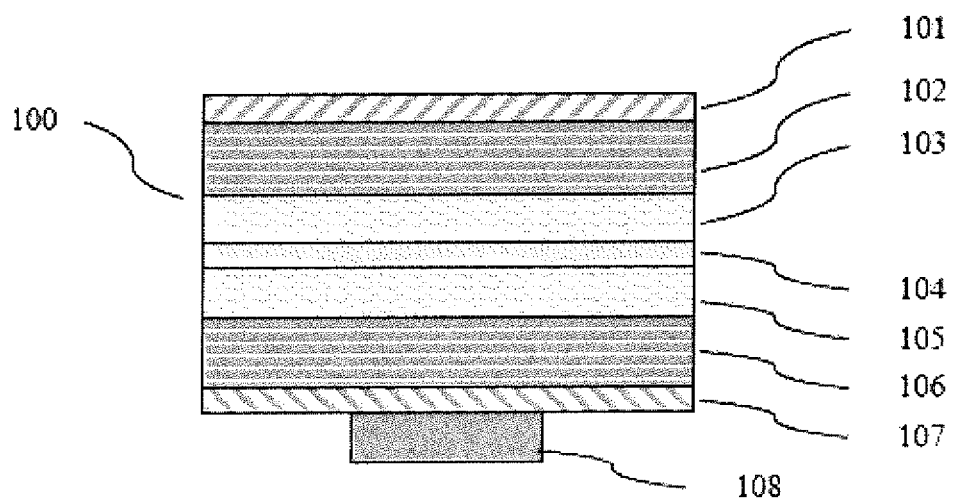
FIG. 1 is a schematic cross-section view of a micro laser diode of VCSEL.

Various exemplary embodiments of the present invention will now be described in detail with reference to the drawings. It should be noted that the relative arrangement of the components and steps, the numerical expressions, and numerical values set forth in these embodiments do not limit the scope of the present invention unless it is specifically stated otherwise.

The following description of at least one exemplary embodiment is merely illustrative in nature and is in no way intended to limit the invention, its application, or uses.

Techniques, methods and apparatus as known by one of ordinary skill in the relevant art may not be discussed in detail but are intended to be part of the specification where appropriate.

In all of the examples illustrated and discussed herein, any specific values should be interpreted to be illustrative only and non-limiting. Thus, other examples of the exemplary embodiments could have different values.

Notice that similar reference numerals and letters refer to similar items in the following figures, and thus once an item is defined in one figure, it is possible that it need not be further discussed for following figures.

Embodiments and examples of the present invention will be described with reference to the drawings.

FIG. 1 shows a schematic cross-section view of a micro laser diode of VCSEL. The VCSEL micro laser diode can be used in the embodiments of the present invention.

As shown in FIG. 1, the micro laser diode 100 includes a lower contact layer 107, a lower Bragg reflector layer 106, a lower spacer layer 105, an active layer 104, an upper spacer layer 103, an upper Bragg reflector layer 102 and an upper contact layer 101.

For example, the micro laser diode 100 can be mounted on a lower metal electrode 108.

Figure 2:
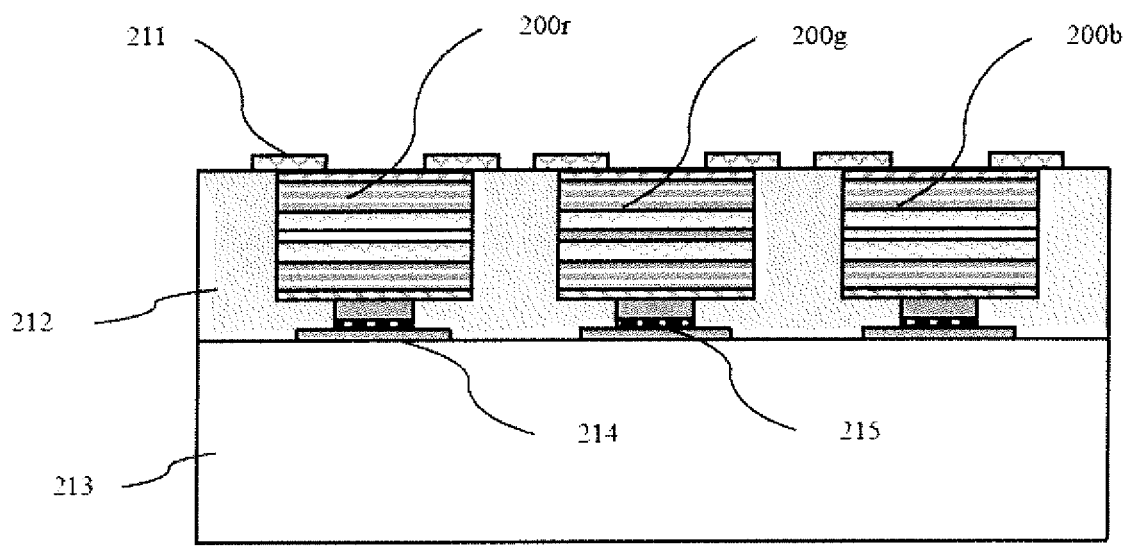
FIG. 2 is a schematic cross-section view of a micro laser diode device according to an embodiment of the present invention.

FIG. 2 shows a schematic cross-section view of a micro laser diode device according to an embodiment of the present invention.

In FIG. 2, the micro laser diode display device comprises a substrate 213. First type electrodes 214 are arranged on the substrate 213. The substrate 213 may have control and drive circuitries, such as AM TFT (active matrix, thin-film transistor). For example, the substrate 213 may a silicon substrate with CMOS circuitries. Alternatively, the substrate 213 may a glass backplane with TFT circuitries. Optionally, the substrate 213 may flexible with circuitries. For example, it may be a flexible printed circuitry board (FPCB).

The micro laser diode display device further comprises a micro laser diode array of at least one color 200r, 200g, 200b and second type electrodes 211. The micro laser diode array is bonded on the substrate 213. The first side (lower side) of micro laser diodes 200r, 200g, 200b is connected to the first type electrodes 214, for example, via a bonding layer 215. The second type electrodes 211l are connected to a second side of the micro laser diodes 200r, 200g, 200b.

For example, the micro laser diodes can be of VCSEL structure as shown in FIG. 1. The at least one color can include red color, blue color and green color.

For example, the first type electrodes are anodes and the second type electrodes are cathode.

For example, the diameter of the micro laser diodes may be 1-500 μm, preferably 10-100 μm and further preferably 20-50 μm. In an example, the diameter of the micro laser diodes may be less than 100 μm.

In the prior art, a laser diode is not used in a display device. In this invention, it is used for display. For example, the micro laser diode display device can be a projection display device and it is used as a light source of a projector. It can project light onto a display screen (display surface). Because of the highly collimated light emitted by the micro laser diodes, it can offer a focus-free display. Compared with a micro-LED projection display device requiring a complicated optical focusing system due to its limited focal depth, the display solution using micro laser diodes will have advantages. This will lead to a new technical trend for display different from that of micro-LED.

As shown in FIG. 2, a dielectric filler layer 212 is filled among the micro laser diodes 200r, 200g, 200b. This structure is suitable for semiconductor processing. For example, it will facilitate forming the second type electrodes (cathodes) on top of the micro laser diodes. Furthermore, it may provide support to the micro laser diodes. Optionally, it may provide isolation between adjacent micro laser diodes.

Figure 3:
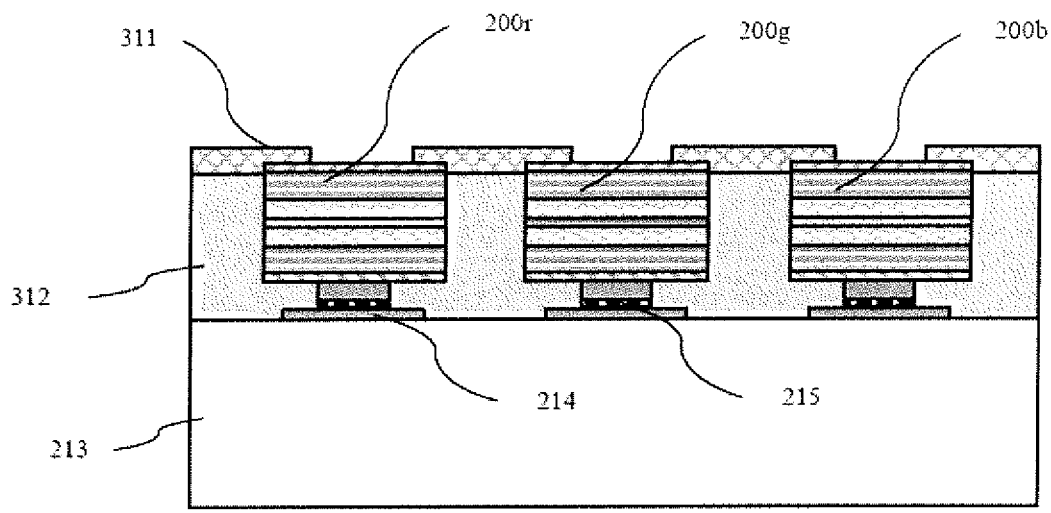
FIG. 3 is a schematic cross-section view of a micro laser diode device according to another embodiment of the present invention.

FIG. 3 shows a schematic cross-section view of a micro laser diode device according to another embodiment of the present invention. The differences between the micro laser diode devices of FIG. 2 and FIG. 3 lie in the second type electrodes 311 and the dielectric filler layer 312.

In an example, as shown in FIG. 3, the dielectric filler layer 312 is lower than the micro laser diodes 200r, 200g, 200b. At least one part of the second type electrodes 311 is formed at a lateral side of the micro laser diodes 200r, 200g, 200b. In this way, it may provide a better Ohmic contact between the electrodes and the diodes. Optionally, this may further provide a better thermal dispersion for the micro laser diode.

In another example, as shown in FIG. 3, the second type electrodes 311 are formed on top of the micro laser diodes and the dielectric filler layer. The second type electrodes 311 are patterned so that the micro laser diodes 200r, 200g, 200b are exposed. Compared with the micro laser diode display device of FIG. 2, the area of the second type electrode is enlarged. This may improve the thermal dispersion of the device.

Alternatively, the second type electrodes 311 may be transparent and is un-patterned. This will simplify the manufacturing of the device.

The second type electrodes can be a common electrode and/or be shorted.

It would be understood by a person skilled in the art that although the above two examples are shown in one figure, they can be implemented separately or in combination.

Figure 4:
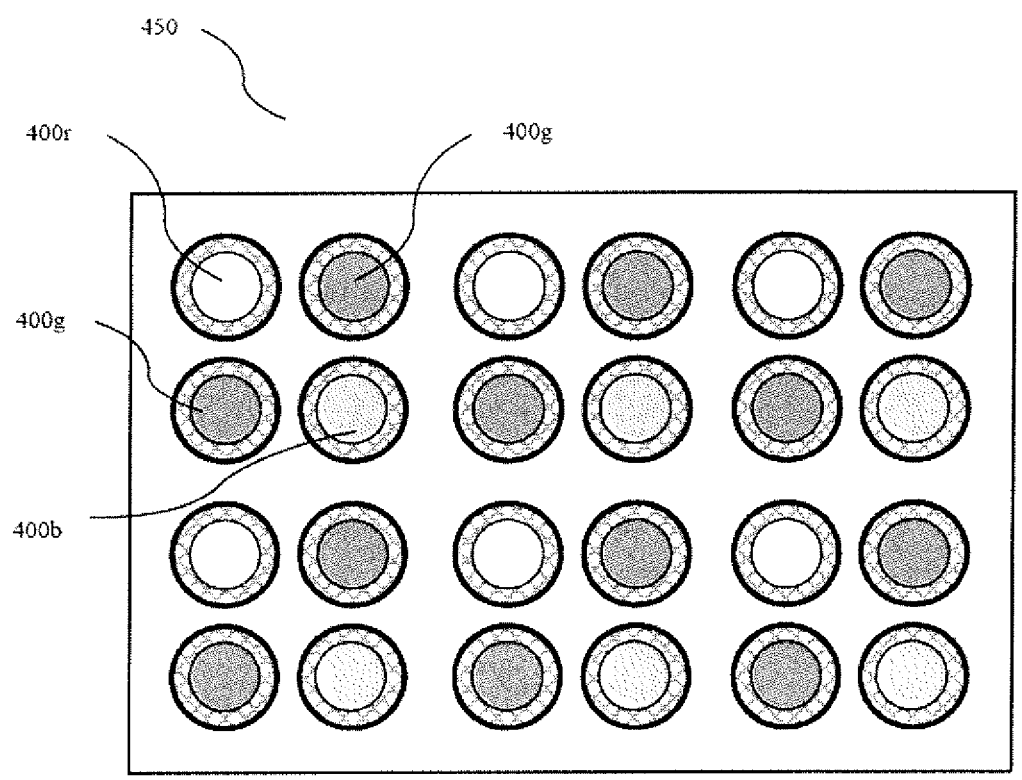
FIG. 4 is a schematic diagram of a top view of a micro laser diode device according to an embodiment of the present invention.

FIG. 4 shows a schematic diagram of a top view of a micro laser diode device according to an embodiment of the present invention.

As shown in FIG. 4, the micro laser diode device 450 includes red color micro laser diodes 400r, green color micro laser diodes 400g and blue color micro laser diodes 400b. They are arranged in multiple units. Each unit includes one red color micro laser diode 400r, two green color micro laser diodes 400g and one blue color micro laser diode 400b.

As shown in FIG. 4, the green micro laser diodes 400g are redundant. This may improve yield/reliability.

The micro laser diode display device according to the embodiments of the present invention can used in an electronics apparatus as a projection display source. The electronics apparatus can be a projector, a projection television, a smart phone with projection display and so on.

Below, a method for transferring micro laser diodes will be described with reference to FIGS. 5-8.

FIGS. 5-8 schematically show the process of transferring micro laser diodes from carrier substrates to a receiving substrate according to an embodiment of the present invention.

Figure 5:
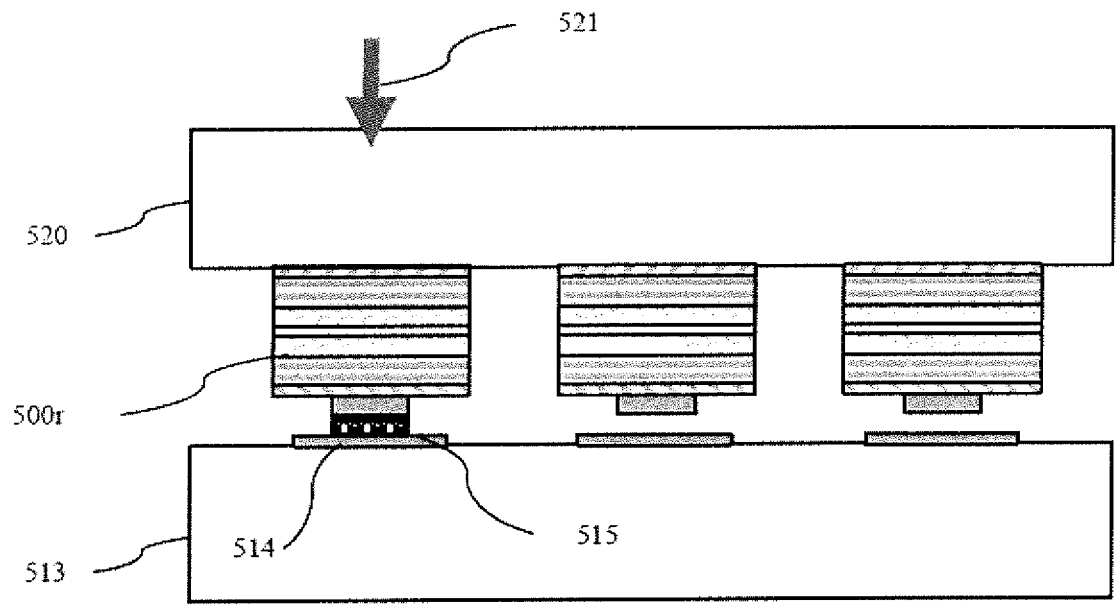
FIGS. 5-9 schematically show the process of transferring micro laser diodes from carrier substrates to a receiving substrate according to an embodiment of the present invention.

As shown in FIG. 5, a bonding layer 515 is formed on a receiving substrate 513. First type electrodes 514 are connected to the bonding layer 515. The first type electrodes 514 can be anodes.

A first side (lower side) of the micro laser diodes 500r on a carrier substrate 520 is brought into contact with the bonding layer 514. The carrier substrate 520 is laser-transparent.

In FIG. 5, the micro laser diodes 500r is of red color, for example. It can be the micro laser diodes of VCSEL structure as shown in FIG. 1.

Selected micro laser diodes 500r are irradiated with laser 521 from the side of the carrier substrate 520 to lift-off the selected micro laser diodes 500r from the carrier substrate 520.

For example, during lifting-off, the micro laser diodes 500r are kept on the receiving substrate 513 through a gravity force. Alternatively, an adhesion force of the bonding layer 515 may also be used to keep the micro laser diodes 500r. Further alternatively, an electrostatic force may be applied to the micro laser diodes 500r to keep it on the receiving substrate 513. Even further alternatively, an electromagnetic force may be applied to the micro laser diodes 500r to keep it on the receiving substrate 513. The above approaches can be used individually or in any combination.

This embodiment proposes a new approach for transferring micro laser diodes. Compared with the prior solution of picking up laser diodes individual with a pick-up head, this embodiment is more suitable for semiconductor processing. For example, it can improve yield. Optionally, it can provide a more efficient transfer. Optionally, the definition of the micro laser diodes may be improved.

Figure 6:
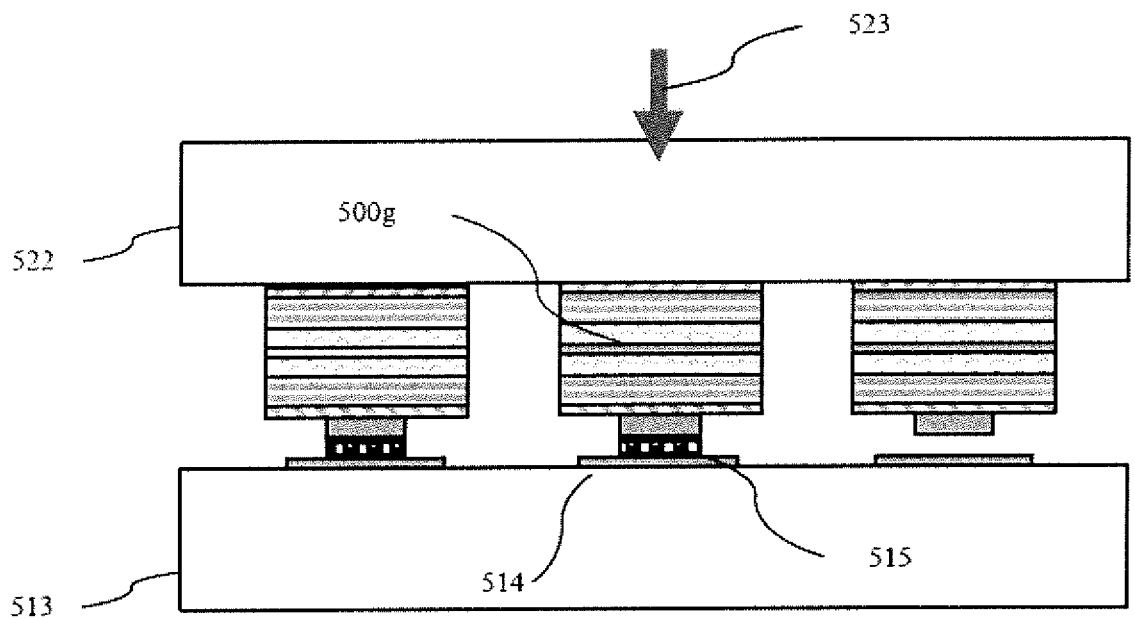
Figure 7:
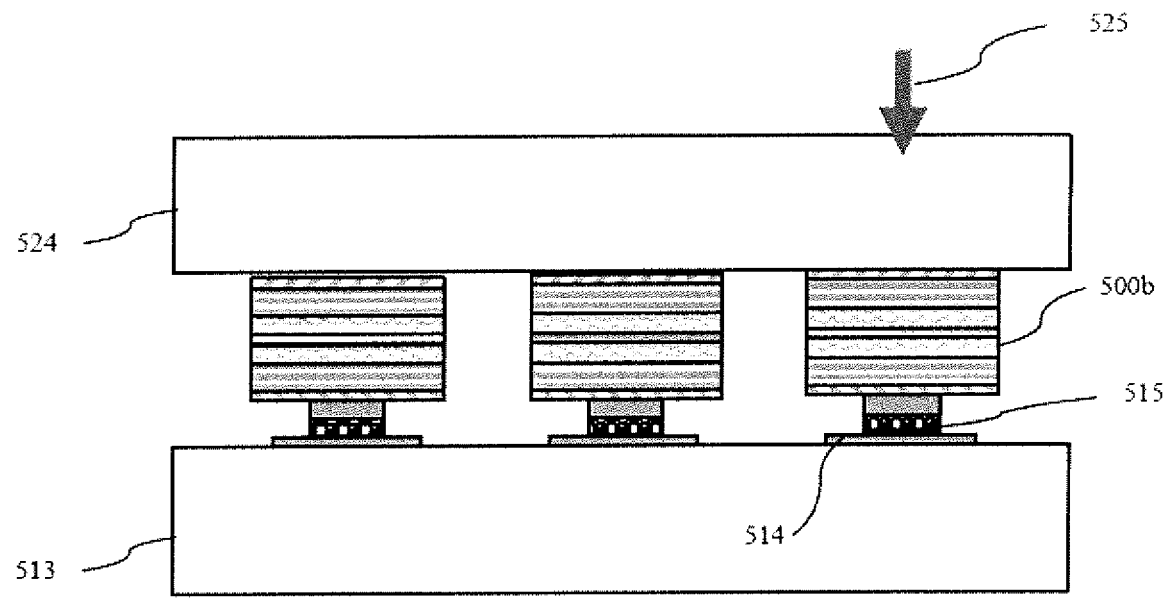

As shown in FIG. 6, green color micro laser diodes 500g on a carrier substrate 522 may selectively be transferred to the receiving substrate 513 by using the selective laser 523. As shown in FIG. 7, blue color micro laser diodes 500b on a carrier substrate 524 may selectively be transferred to the receiving substrate 513 by using the selective laser 525. The processing is similar with the transferring of red color micro laser diodes shown in FIG. 5, and thus is omitted.

After transferring, the bonding layer 515 may be cured.

Figure 8:
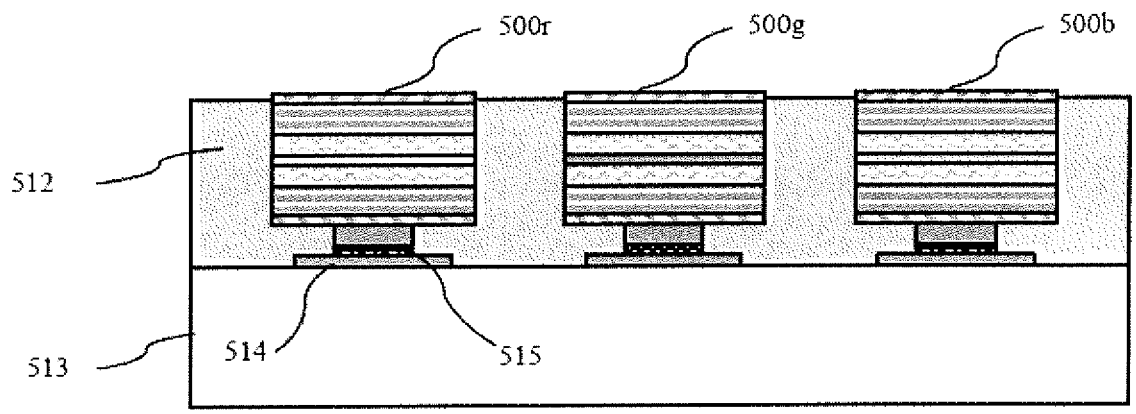

As shown in FIG. 8, a dielectric filler material is filled among the micro laser diodes 500r, 500g, 500b to form a dielectric filler layer 512. The dielectric filler layer 512 may be flush with the upper surface of the micro laser diodes. Alternatively, it can be etched back lower than the upper surface of the micro laser diodes so that a top electrode may be formed to be in contact with at least one part of the lateral side of a micro laser LED, as shown in FIG. 3.

This processing may provide flexibility for a designer or a manufacturer in designing and manufacturing a micro laser diodes device.

Figure 9:
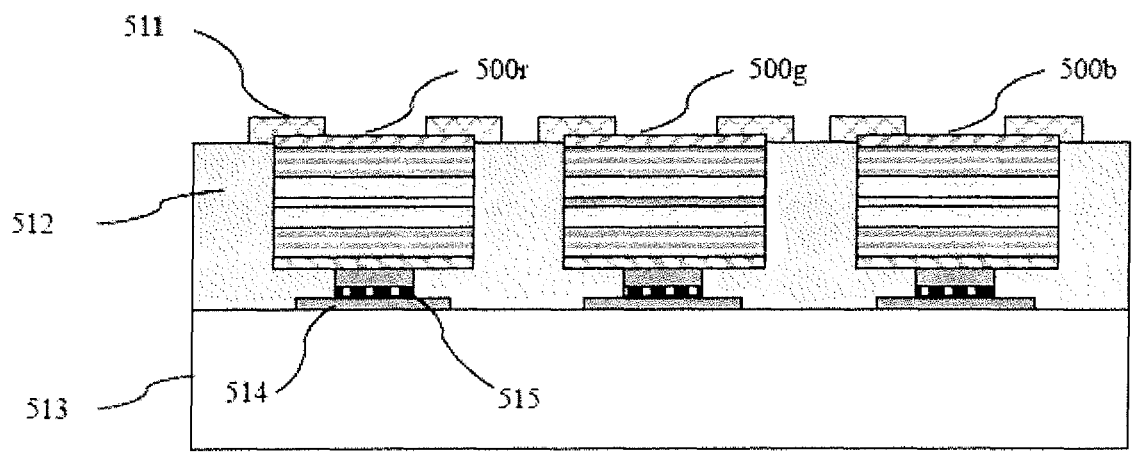

As shown in FIG. 9, second type electrodes 511 are formed to be connected to a second side (upper side) of the micro laser diodes 500r, 500g, 500b.

For example, during the second type electrodes 511 are formed, an electrode layer are formed on the micro laser diodes 500r, 500g, 500b and the dielectric filler layer 512. Then, the electrode layer is patterned to expose the micro laser diodes to form the second type electrodes 511.

Alternatively, the electrode layer is transparent and may not be patterned. This will simplify the manufacture processing and thus may reduce the cost.

Although it is not shown, at least one part of the second type electrodes 511 may be formed at a lateral side of the micro laser diodes 500r, 500g, 500b.

For example, the second type electrode 511 may be a common electrode.

For example, the first type electrodes 514 are anodes and the second type electrodes 511 are cathode.

For example, the diameter of the micro laser diodes 500r, 500g, 500b may be less than 100 μm.

For example, a protection layer may be applied on the top of the transferred micro laser diodes.

In another embodiment, a method for manufacturing a micro laser diode device may include transferring micro laser diodes to a receiving substrate of the micro laser diode device by using the method according to any of the embodiments of the present invention.

For example, the manufacturing method can be used to manufacture the micro laser diode display device according to the embodiments of the present invention. Alternatively, the method can further be used in manufacturing a micro laser diode device, and the micro laser diode device may be used in micro laser printers, optical communications, collimated light sourcing, micro-displays, micro-projections and so on.

Although some specific embodiments of the present invention have been demonstrated in detail with examples, it should be understood by a person skilled in the art that the above examples are only intended to be illustrative but not to limit the scope of the present invention.

What is claimed is:

1. A method for transferring micro laser diodes, comprising:
    forming a bonding layer on a receiving substrate, wherein first type electrodes are connected to the bonding layer;
    bringing a first side of the micro laser diodes on a carrier substrate into contact with the bonding layer, wherein the carrier substrate is laser-transparent;
    irradiating selected micro laser diodes with laser from a side of the carrier substrate to lift-off the selected micro laser diodes from the carrier substrate;
    filling a dielectric filler material among the micro laser diodes to form a dielectric filler layers;
    etching back the dielectric filler layer such that an upper surface of the dielectric filler layer is lower than an upper surface of a second side of the micro laser diodes; and
    forming an electrode layer on the micro layer diodes and the dielectric filler layer, and patterning the electrode layer to expose the micro laser diodes to form second type electrodes contacting the upper surface of the dielectric filler layer and the upper surface of the second side of the micro laser diode, wherein at least one part of the second type electrodes is formed at a lateral side of the micro laser diodes.

2. The method according to claim 1, wherein the micro laser diodes are kept on the receiving substrate during lifting-off through at least one of a gravity force, an adhesion force of the bonding layer, an electrostatic force applied to the micro laser diodes and an electromagnetic force applied to the micro laser diodes.

3. The method according to claim 1, wherein the micro laser diodes are of vertical cavity surface emitting laser structure, which includes a lower contact layer, a lower Bragg reflector layer, a lower spacer layer, an active layer, an upper spacer layer, an upper Bragg reflector layer and an upper contact layer.

4. The method according to claim 1, wherein the micro laser diodes include red, blue and green micro laser diodes.

5. The method according to claim 1, wherein the diameter of the micro laser diodes is less than 100 μm.

6. The method according to claim 1, wherein the first type electrodes are anodes and the second type electrodes are cathode.

7. A method for manufacturing a micro laser diode device, including transferring micro laser diodes to a receiving substrate of the micro laser diode device by using the method according to claim 1.

* * * * *